US006989281B2

(12) United States Patent
Yamamoto et al.

(10) Patent No.: US 6,989,281 B2
(45) Date of Patent: Jan. 24, 2006

(54) CLEANING METHOD FOR A SEMICONDUCTOR DEVICE MANUFACTURING APPARATUS

(75) Inventors: Akihito Yamamoto, Yokohama (JP); Takashi Nakao, Kawasaki (JP); Yuuichi Mikata, Yokohama (JP); Yoshitaka Tsunashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/957,609

(22) Filed: Oct. 5, 2004

(65) Prior Publication Data

US 2005/0059203 A1 Mar. 17, 2005

Related U.S. Application Data

(62) Division of application No. 10/230,423, filed on Aug. 29, 2002.

(30) Foreign Application Priority Data

Aug. 31, 2001 (JP) ............................ 2001-265143

(51) Int. Cl.
*H01L 21/00* (2006.01)

(52) U.S. Cl. ............................................ 438/9; 438/22

(58) Field of Classification Search ................... 438/22
See application file for complete search history.

(56) References Cited

U.S. PATENT DOCUMENTS

| | | | |
|---|---|---|---|
| 5,403,433 A | 4/1995 | Morrison et al. | |
| 5,469,259 A | 11/1995 | Golby et al. | |
| 5,564,830 A | 10/1996 | Bobel et al. | |
| 5,640,246 A | 6/1997 | Castonguay | |
| 5,710,631 A | 1/1998 | Bou-Ghannam et al. | |
| 5,729,640 A | 3/1998 | Castonguay | |
| 6,081,334 A * | 6/2000 | Grimbergen et al. | 356/499 |
| 6,331,890 B1 * | 12/2001 | Marumo et al. | 356/369 |
| 6,476,921 B1 | 11/2002 | Saka et al. | |
| 6,750,977 B2 * | 6/2004 | Otsubo et al. | 356/632 |

FOREIGN PATENT DOCUMENTS

| | | |
|---|---|---|
| JP | 04-082214 | 3/1992 |
| JP | 04-206822 | 7/1992 |
| JP | 04-343220 | 11/1992 |
| JP | 07-307301 | 11/1995 |
| JP | 10-233391 | 9/1998 |
| JP | 11-200053 | 7/1999 |

* cited by examiner

*Primary Examiner*—Thao P. Le
(74) *Attorney, Agent, or Firm*—Finnegan, Henderson, Farabow, Garrett & Dunner, L.L.P.

(57) ABSTRACT

A cleaning method for a semiconductor device manufacturing apparatus includes a process of forming a film on a subject piece in a processing chamber, applying light having a predetermined wavelength to a monitoring section to indirectly monitor a thickness of a film formed on the subject piece, introducing cleaning gas capable of removing a substance deposited on the monitoring section into the processing chamber, measuring a reflection light which is the application light reflected near the monitoring section, measuring an amount of a substance corresponding to a thickness of a film deposited on the monitoring section based on a measurement result of the reflection light; and introducing, into the processing chamber, a cleaning gas which can remove the substance on the monitoring section until a measurement value of the amount of the substance on the monitoring section becomes zero.

8 Claims, 7 Drawing Sheets

CLEANING METHOD FOR A SEMICONDUCTOR DEVICE MANUFACTURING APPARATUS

CROSS-REFERENCE TO RELATED APPLICATIONS

This application is a division of application Ser. No. 10/230,423, filed Aug. 29, 2002, which is incorporated herein in its entirety by reference. This application is also based upon and claims priority from prior Japanese Patent Application No. 2001-265143, filed Aug. 31, 2001, the entire contents of which are incorporated herein by reference.

BACKGROUND OF THE INVENTION

1. Field of the Invention

The present invention relates to a semiconductor device manufacturing method, a semiconductor device manufacturing apparatus, a semiconductor device manufacturing system, and a cleaning method for a semiconductor device manufacturing apparatus. More specifically, it relates to a semiconductor device manufacturing method, used in a film formation process such as a CVD method, a semiconductor device manufacturing apparatus, a semiconductor device manufacturing system, and a cleaning method for a semiconductor device manufacturing apparatus.

2. Description of the Related Art

Usually, in a film formation process in a manufacturing process of a semiconductor device, a desired thin film is formed on a wafer to be processed by a film formation apparatus. Then, to check whether the thus formed thin film has a desired film thickness, the wafer is taken out of the reaction chamber (processing chamber) of the film formation apparatus to measure the film thickness using a film-thickness measurement device separate from the film formation apparatus.

Recently, there has been suggested a semiconductor device manufacturing apparatus which measures the thickness of a film in-situ concurrently with a film forming step in order to control the film thickness at higher accuracy or to improve a production efficiency of the semiconductor device. For example, in a semiconductor device manufacturing apparatus disclosed in Jpn. Pat. Appln. KOKAI Publication No. 4-82214, laser light is applied to a wafer on which a film is being formed in a quartz chamber (processing chamber) from the outside thereof. Then, the intensity of the light reflected by optical interference in the thus formed thin film on the wafer is measured outside the quartz chamber. Thus, the film thickness of the thin film deposited on the wafer is measured concurrently while it is being formed.

Furthermore, in a vacuum CVD apparatus disclosed in Jpn. Pat Appln. KOKAI Publication No. 4-343220, a quartz plate is disposed together with a port having a wafer (semiconductor substrate) mounted thereon in a furnace tube (processing chamber). Then, upon the start of film formation, light from a halogen lamp is applied to the quartz plate. Then, an intensity change of light transmitted through the quartz plate is detected to thereby measure the thickness of a film deposited on the quartz plate during the film formation. Then, the thickness of the film deposited on the quartz plate is sequentially checked during the film formation against beforehand obtained conditions of the film formation, thereby indirectly measuring the thickness of the thin film deposited on the wafer concurrently while the film is being formed.

Furthermore, to form a better thin film, there is contrived a semiconductor device manufacturing apparatus equipped with a cleaning mechanism for cleaning the interior of the processing chamber in which a wafer is housed. For example, in a semiconductor device manufacturing apparatus disclosed in Jpn. Pat. Appln. KOKAI Publication No. 4-206822, an etchant gas is introduced into a reaction tube (processing chamber) made of quartz or the like. Thereby, a film deposited on the inner wall of the reaction tube is etched off for cleaning. In this case, laser light is applied from a laser light emitter disposed outside the reaction tube so as to pass inside. Then, a detector disposed opposite the laser light emitter, the other side of the reaction tube, is used to monitor (observe) the intensity change of the laser light transmitted through the reaction tube. Since the film deposited on the reaction tube is thin near the end of the etching processing, the intensity of the transmitted laser light increases. When the deposited film disappears from the reaction tube, the intensity of the transmitted laser light becomes a roughly constant level. Thereby, it is confirmed that the interior of the reaction tube has been cleaned, thus detecting the end of etching.

As described above, the technologies disclosed in Jpn. Pat Appln. KOKAI Publication Nos.4-82214, 4-343220 and 4-206822 have roughly two problems of apparatus configuration (processing environment and conducting environment) and measurement accuracy which will be described below.

As in the respective inventions described above, in a configuration in which a measuring light such as laser light passes through the interior of the processing chamber, it is necessary to maintain an optical path in the processing chamber. Meanwhile, noise which deteriorates the measurement accuracy is caused by fluctuating wafer temperature, gas introduced into the processing chamber, and the atmosphere inside the processing chamber. Therefore, to prevent the noise from occurring in the information of the measuring light, it is necessary to arrange the optical path at an optically sufficiently stable position. This may cause various restrictions on the construction of the processing chamber. Furthermore, it is necessary that at least a region (space) which corresponds to the optical path in the processing chamber should be optically sufficiently stable. This may place restrictions atmospheric conditions in the processing chamber, components of materials (gas or the like) used in film formation processing, components of a gas (etchant gas) for cleaning, etc. This may in turn place restrictions on service conditions of the semiconductor device manufacturing apparatus (vacuum CVD apparatus).

In addition, according to the technology disclosed in Jpn. Pat. Appln. KOKAI Publication No. 4-343220, the thickness of a film deposited on a quartz plate arranged in a processing chamber is measured to indirectly measure the film thickness of a thin film deposited on a wafer. If this indirect measurement is used, a measurement subject piece such as the quartz plate is typically positioned as close as possible to the wafer to improve the measurement accuracy. As mentioned above, however, the optical path for measurement needs to be optically sufficiently stable. Therefore, it is necessary to arrange a measurement system including the measurement subject piece and the optical path at a position where the measuring light is scarcely affected by a temperature change of the wafer and the like. Therefore, it is difficult to simply bring the measurement subject piece close to the wafer in order to improve the measurement accuracy.

On the other hand, if the measurement subject piece is brought too close to the wafer, it might disturb a proper flow of film formation gas in the vicinity of the wafer. Alternatively, the temperature change of the measurement subject piece itself might disturb a properly preset atmosphere in the vicinity of the wafer. As understood from the above, if the measurement subject piece is carelessly arranged too close to the wafer with the intention of improving the measurement accuracy, it may rather deteriorate the film quality and the like of the thin film formed on the wafer.

As discussed above, when the film thickness of the thin film deposited on the wafer is indirectly measured, it is difficult to set the measurement system, and the apparatus configuration is usually complicated. Particularly, in a batch processing apparatus, for sweepingly processing a plurality of wafers in a batch as by the technology disclosed in Jpn. Pat. Appln. KOKAI Publication 4-343220, it is liable to become more difficult to reconcile the improvement in measurement accuracy with a higher degree of freedom of the apparatus configuration. In a batch processing apparatus, a plurality of wafers are arranged at different positions. In this state, taking into account the above-mentioned intra-apparatus constructional restrictions, it is extremely difficult to further improve the measurement accuracy for the plurality of wafers while maintaining a roughly uniform measurement accuracy level for the respective wafers.

Furthermore, as by the technology disclosed in Jpn. Pat. Appln. KOKAI Publication No. 4-82214, taking into account the construction of the batch processing apparatus, it is also very difficult to directly measure the film thickness of a thin film on each of wafers by directly applying the measuring light onto all of the wafers during the film formation.

BRIEF SUMMARY OF THE INVENTION

According to an aspect of the present invention, there is provided a cleaning method for a semiconductor device manufacturing apparatus, comprising:

conducting a processing of forming a film on a subject piece in a processing chamber which includes at least one of the subject piece on which the processing of forming a film is performed, and after that, taking out, from the processing chamber, the subject piece on which the processing of forming a film has been conducted;

applying the light having a predetermined wavelength to a monitoring section which is provided at a tip of at least one monitoring device to indirectly monitor a thickness of a film formed on the subject piece, while the light is isolated from an atmosphere in the processing chamber and a substance in the processing chamber, and introducing cleaning gas capable of removing a substance deposited on the monitoring section into the processing chamber;

measuring a reflection light which is the application light is reflected near the monitoring section, while the reflection light is isolated from the atmosphere in the processing chamber and the substance introduced into the processing chamber;

measuring an amount of a substance corresponding to a thickness of a film deposited on the monitoring section based on a measurement result of the reflection light; and introducing, into the processing chamber, a cleaning gas which can remove the substance on the monitoring section until a measurement value of the amount of the substance on the monitoring section becomes 0.

DETAILED DESCRIPTION OF THE INVENTION

The following describes a semiconductor device manufacturing method regarding one embodiment of the present invention, a semiconductor device manufacturing apparatus, a semiconductor device manufacturing system, and a cleaning method for a semiconductor device manufacturing apparatus with reference to FIGS. 1–9.

First, the semiconductor device manufacturing apparatus regarding one embodiment will be described with reference to FIGS. 1–3.

Figure 1:
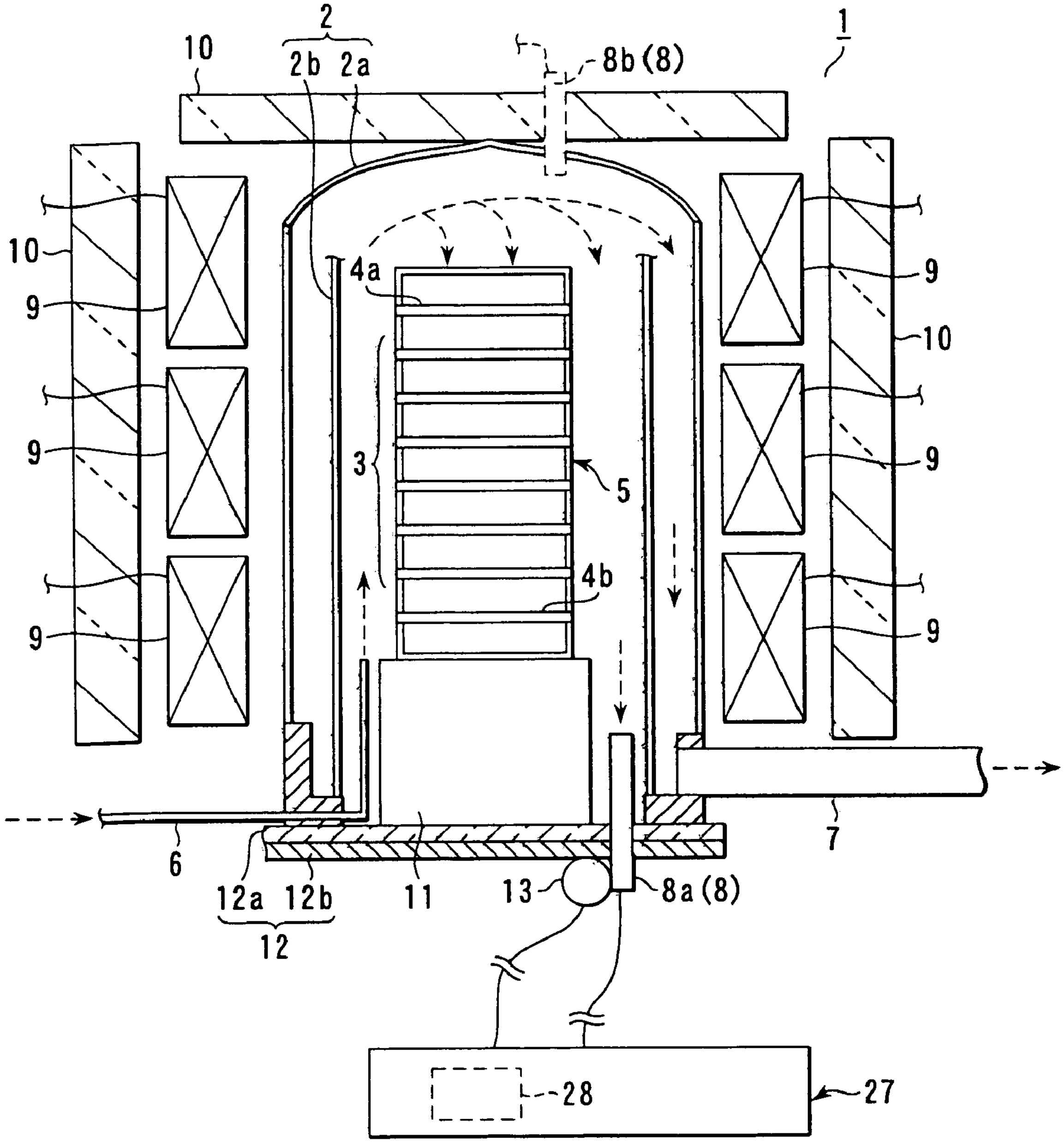
FIG. 1 is a cross-sectional view for outlining a configuration of a CVD apparatus used as a semiconductor device manufacturing apparatus regarding to one embodiment.

FIG. 1 is a cross-sectional view for outlining a configuration of a film formation apparatus 1 used as the semiconductor device manufacturing apparatus. This film formation apparatus 1 is specifically a batch CVD (chemical vapor deposition) apparatus. Note that, in FIG. 1, a lower side film-thickness monitor **8*a*** which will be described later and its peripheral devices are simplified or omitted in the illustration.

As shown in FIG. 1, a reaction chamber 2 used as a processing chamber is comprised of an outer tube **2*a* and an inner tube 2*b*. The outer tube 2*a* acts to shield an interior of the reaction chamber 2 from the outside. The inner tube 2*b* is provided within the outer tube 2*a* and includes therein a plurality of wafers (semiconductor substrates) 3 as subject pieces. Around the outer tube 2*a* of the reaction chamber 2, a plurality of heaters 9 are arranged. These heaters 9 each act to regulate an internal temperature of the reaction chamber 2 at a predetermined value. These heaters 9 are each surrounded by a plurality of heat insulators 10. These heat insulators 10 each act to hold at a predetermined temperature the interior of the reaction chamber 2 heated by each the heaters 9. Each of the heaters 9 and each of the heat insulators 10 are arranged in such a manner as to substantially uniformly maintain the interior of the reaction chamber 2 at a constant temperature. The heaters 9 are each connected to a processing controller 27** which will be described later.

The wafers 3 are each housed at the middle in the inner tube 2*b* of the reaction chamber 2 while mounted on a wafer support bench 5. The wafers 3 are each mounted on the wafer support bench so that their surfaces do not contact each other and so as to be vertically stacked in a plurality of layers. Furthermore, monitoring wafers (sample substrates) 4*a*, 4*b* for monitoring the processing state of the respective wafers 3 are arranged at the upper and lower ends of the wafer support bench 5, respectively. The wafer support bench 5 is attached through a heat-keeping bench 11 to a door 12 which acts as a processing chamber opening/closing section.

As shown in FIG. 1, the door 12 is provided at the lower part of the reaction chamber 2. The door 12 has a two-sheet construction as shown in FIGS. 1 and 2. Specifically, an upper door part 12*a* of the door 12 which faces the interior of the reaction chamber 2 is made of quartz, and a lower door part 12*b* thereof which is exposed toward the outside of the reaction chamber 2 is made of a metal. The door 12 is so arranged as to be vertically moved by a motor, not shown. By moving the door 12 downward to open the reaction chamber 2 at its opening, the wafer 3 can be loaded (housed) into the reaction chamber 2 and unloaded (taken out) from the reaction chamber 2. Furthermore, for example, by housing the wafer 3 in the reaction chamber 2 and then moving the door 12 upward to close the reaction chamber 2 at the opening, the interior of the reaction chamber 2 can be shielded.

The reaction chamber 2 is equipped with a gas introduction tube 6. This gas introduction tube 6 is connected to a mass-flow controller, not shown, or the like. The mass-flow controller of the like is used to introduce a processing gas (reaction gas) through the gas introduction tube 6 into the reaction chamber 2 when CVD is carried out. Furthermore, the reaction chamber 2 is equipped with a gas exhaust tube 7. This gas exhaust tube 7 is connected to an exhaust pump (vacuum pump) and an opening/closing (pressure regulation valve) not shown. The processing gas, if used, is discharged (exhausted) from the inside of the reaction chamber 2 to its outside through the gas exhaust tube 7 by the exhaust pump or the opening/closing tube. That is, as shown by a broken line in FIG. 1, the processing gas is introduced through the gas introduction tube 6 into the reaction chamber 2, passed through a region where the wafers 3 are arranged, and then discharged from the reaction chamber 3 through the gas exhaust tube 7. Furthermore, the pressure inside the reaction chamber 2 can be set and held at a predetermined value by adjusting the operating state of the exhaust pump and the opening/closing tube. The reaction chamber 2 is equipped at its lower part with a film-thickness monitor 8 for monitoring the film thickness. The film-thickness monitor 8 is mounted through the door 12.

Figure 2:
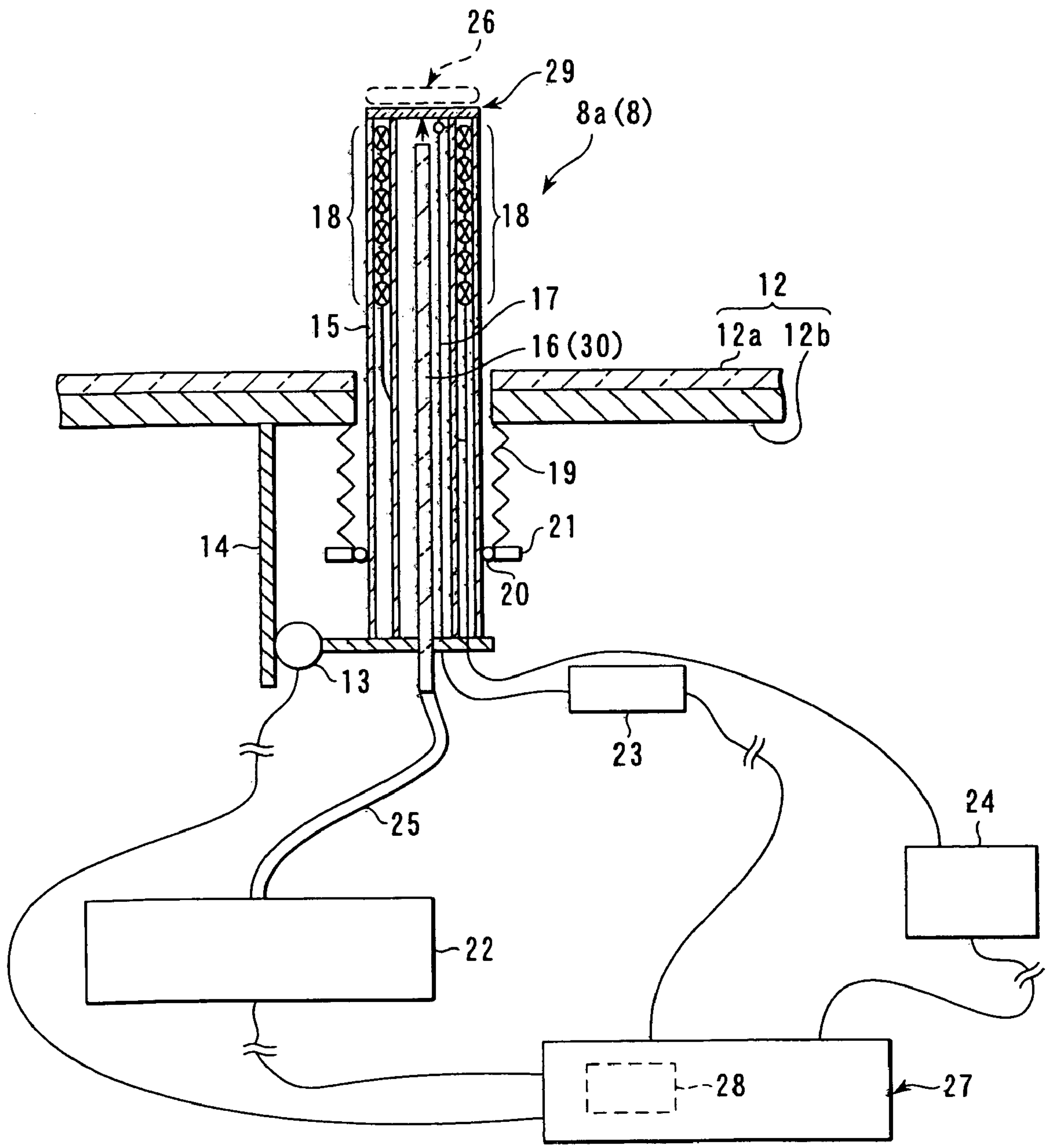
FIG. 2 is a vertical cross-sectional expanded view for showing a configuration near a film-thickness monitoring device used as a film-thickness measurement device provided in the CVD apparatus of FIG. 1.

FIG. 2 shows the film-thickness monitor 8 and one example of its peripheral devices. This film-thickness monitor 8 monitors the thickness of a film on each of the wafers 3 based on the amount of a substance 26 on its monitoring section 29. As described above, the semiconductor device manufacturing apparatus of the present embodiment is the batch CVD apparatus 1 which is one type of film formation apparatus. Therefore, specifically the film-thickness monitor 8 indirectly monitors the thickness of a film formed on each of the wafers 3 based on the amount of the substance 26 deposited on the monitoring section 29.

The film-thickness monitor 8 is arranged so that its tip can be arbitrarily inserted into or removed from the inner tube 2*b* of the reaction chamber 2. This film-thickness monitor 8 is referred to as a lower side film-thickness monitor 8*a*. The film-thickness monitor 8 may be provided at a position other than the lower side of the reaction chamber 2. For example, as shown by a broken line in FIG. 1, the film-thickness monitor 8 may be provided at the upper part of the outer tube 2*a* of the reaction chamber 2. This film-thickness monitor 8 is referred to as an upper-side film-thickness monitor 8*b*, for example. This upper-side film-thickness monitor 8*b* is also arranged so that its tip can be arbitrarily inserted into or removed from the reaction chamber 2. In addition, this upper-side film-thickness monitor 8*b* may be used together with the lower side film-thickness monitor 8*a*. In addition to the lower and upper parts of the reaction chamber 2, a plurality of film-thickness monitors which are not shown may be provided at plural different positions so that they may be simultaneously used.

For example, the surface of a predetermined one of the wafers 3 is divided into a plurality of regions. Then, the same number of film-thickness monitors as regions are provided in one-to-one correspondence thereto. In this case, the positions of these film-thickness monitors are each set in such a manner that the amount of a substance deposited on the monitoring section of each of the film-thickness monitors may correspond to the thickness of the film formed on the surface of the wafer 3 in each of the regions. This enables highly accurately measuring a distribution of the thickness of the film formed on the surface of the wafer 3.

Furthermore, the same number of film-thickness monitors as wafers 3 are provided so as to correspond to the plurality of wafers 3 vertically arranged in the reaction chamber 2 in a one-to-one relationship. In this case, the position of each of the film-thickness monitors is set so that the amount of the deposit on the monitoring section of each of the film-thickness monitors corresponds to the thickness of the film deposited on the surface of each of the wafers 3. This enables individually measuring the thickness of the film formed on the surface of each of the wafers 3.

Furthermore, two film-thickness monitors are provided in one-to-one correspondence to the two monitoring wafers 4*a*, 4*b* arranged above and below the stack of the plurality of wafers 3 respectively. In this case, the position of each of the film-thickness monitors is set so that the amount of the deposit on the monitoring section of each of the film-thickness monitors corresponds to the thickness of the film deposited on the surface of each of the monitoring wafers 4*a*, 4*b*. This enables measuring the thickness of the film formed on the surface of each of the wafers 3.

Furthermore, the surface of each of the two monitoring wafers 4*a*, 4*b* is divided into a plurality of regions. Then, the same number of the film-thickness monitors as regions of the respective wafers 4*a*, 4*b* are provided in one-to-one correspondence to the regions of the respective monitoring wafers 4*a*, 4*b*. In this case, the position of each of the film-thickness monitors is set so that the amount of the deposit on the monitoring section of each of the film-thickness monitors corresponds to the thickness of the film deposited on the surface of each of the monitoring wafers 4*a*, 4*b* in each of the regions. This enables highly accurately measuring a distribution of the thickness of the film formed on the surface of each of the wafers 3.

By providing a plurality of film-thickness monitors for each unit of the CVD apparatus 1 in this way, it is possible to improve a measurement accuracy of the thickness of the film formed on the surface of the wafer 3. In the following, however, such a case will be described that the lower side film-thickness monitor 8*a* is also used.

The following will describe in detail the lower side film-thickness monitor 8*a* with reference to FIG. 2. FIG. 2 is a vertical cross-sectional expanded view for showing a construction of the lower side film-thickness monitor 8*a* and its periphery as well as peripheral devices.

As shown in FIG. 2, the lower side film-thickness monitor 8*a* is provided at its one end with the monitoring section 29 made of a material capable of transmitting and reflecting light having a predetermined wavelength. Specifically, the monitoring section 29 is made of quartz. Furthermore, the lower side film-thickness monitor 8*a* is provided with a light application section 16 for applying light having the predetermined wavelength to the monitoring section 29 and a light reception section 30 for receiving a reflected light of the application light in the monitoring section 29. Moreover, the lower side film-thickness monitor 8*a* is provided with a housing 15 for serving as an optical path protector which is configured so as to isolate an optical path including the light application section 16, the application light, the reflected light and the light reception section 30 from the atmosphere in the reaction chamber 2 and the substance introduced thereinto. This housing 15 is formed into a cylindrical shape, and is also called a monitor protection tube. Therefore, the lower side film-thickness monitor 8*a* has a structure in which an outer portion of the housing 15 is exposed to the atmosphere and the substance in the reaction chamber 2. That is, the monitoring section 29 has its outer part exposed to the atmosphere and the substance in the reaction chamber 2.

As described above, the lower side film-thickness monitor 8*a* is inserted through the door 12 from its lower side into the reaction chamber 2. This causes a film made of a predetermined material to be stuck mainly on the upper surface of the monitoring section 29 on the outer wall surface of the housing 15, while a CVD reaction is occurring in the reaction chamber 2. That is, the lower side film-thickness monitor 8*a* indirectly measures the thickness of a film formed on the surface of the wafer 3 by measuring with light the thickness of a film deposited on the upper surface (outer surface) of the monitoring section 29.

The light application section 16 is connected to a film-thickness measurement section 22 for serving as a measurement device to measure an amount of the deposit on the monitoring section 29. This film-thickness measurement section 22 measures the amount of the deposited film 26 by measuring a reflected light. That is, the film-thickness measurement section 22 measures the amount of the deposited film 26 on the monitoring section 29 based on a signal sent from the light reception section 30 which has received the reflected light. The measurement light having the predetermined wavelength emitted by the film-thickness measurement section 22 passes through an optical fiber extension line 25 and enters the optical fiber 16 for serving as the light application section. In the following description, the measurement light having the predetermined wavelength is abbreviated to measurement light. The measurement light introduced into the optical fiber 16 is applied, via this optical fiber 16, to the lower surface (inner surface) of the monitoring section 29 in the monitor protection tube 15, as shown by a solid arrow in FIG. 2. The measurement light thus applied to the monitoring section 29 is reflected in the vicinity of the monitoring section 29, so that it becomes a reflected light.

This reflected light mainly consists of the following three reflected lights. The first is light reflected by the lower surface of the monitoring section 29 made of quartz. The second is light reflected by an interface between the upper surface of the monitoring section 29 and the deposit (deposited film) 26 deposited on the upper surface of the monitoring section 29. The third is light reflected by the surface of the deposited film 26 on the upper surface of the monitoring section 29. The reflected light consisting of these types of light gives a reflection intensity corresponding to the film thickness of the deposited film 26 on the upper surface of the monitoring section 29.

The reflected light partially enters the optical fiber 16 and passes therethrough and then returns to the film-thickness measurement section 22. In the present embodiment, as shown in FIG. 2, the light application section 16 which applies light and the light reception section 30 which receives the reflected light are formed integrally as one optical fiber. However, the light application section 16 and the light reception section 30 are not limited to such a configuration but may be configured separately from each other. A synthetic reflected light made incident upon the film-thickness measurement section 22 is guided by a beam splitter, not shown, in the film-thickness measurement section 22 to a photo-detector, not shown either. This photo-detector can detect the reflection intensity (light intensity) of the reflected light to thereby determine the amount of the deposited film 26 deposited on the surface of each of the wafers 3. It is in turn possible to determine the film thickness of the deposited film 26 deposited on the surface of each of the wafers 3. In measurement of the intensity of measurement light, it may have a predetermined one or a plurality of different wavelengths. If the measurement light has a plurality of different wavelengths, a spectroscopic photo-detector can be used in measurement. The single or the plurality of wavelengths of the measurement light may be fixed or variable.

The interior of the reaction chamber 2 needs to be shielded from the outside thereof in construction. For this purpose, as shown in FIG. 2, air-tightness between the monitor protection tube 15 and the reaction chamber 12 is maintained by a sealing bellows 19, a bellows support plate 21, and a sealing O-ring 20. The sealing bellows 19 used here can be telescoped, so that a motor 13 serving as a position adjustment device can be used to arrange the monitoring section 29 at a predetermined height. The motor 13 is mounted movably on a rail 14 attached to the lower side of the door 12. The rail 14 is specifically attached to the door 12 in such a manner that its longitudinal direction may be vertical. The monitoring section 29 is driven by the motor 13 to move vertically along the longitudinal direction of the rail 14. Specifically, the monitoring section 29 is driven by the motor 13 to a position where the thickness of a film on a desired one of the wafers 3 can be measured highly accurately in an appropriate condition. Alternatively, the monitoring section 29 is driven by the motor 13 to a position where the thickness of a film in a predetermined region on a desired one of the wafers 3 highly accurately in an appropriate condition.

The lower side film-thickness monitor 8*a* has a monitoring heater 18 serving as a temperature adjustment device. The monitoring heater 18 is used to heat the interior of the monitor protection tube 15. The monitoring heater 18 is connected to a heater control section 24. Further, in the monitor protection tube 16 is provided a thermo-couple 17 serving as a monitoring-section temperature measurement device. The thermo-couple 17 is connected to a voltmeter 23. This configuration enables accurately measuring the temperature of the interior of the monitor protection tube 15. Furthermore, based on information of the temperature sent from the thermo-couple 17, the operating state of the monitoring heater 18 can be controlled using the heater control section 24 and also the temperature of the interior of the monitor protection tube 15 can be regulated at a predetermined value.

The lower side film-thickness monitor 8*a*, the motor 13, the film-thickness measurement section 22, the voltage meter 23, and the heater control section 24 are all connected to a processing control section 27. The processing control section 27 controls the operating state of the CVD apparatus 1 as a controller of the CVD apparatus 1. Specifically, the processing control section 27 controls the motor 13, the heater control section 24, etc. so that the amount of the deposited film 26 deposited on the upper surface of the monitoring section 29 can be measured in an appropriate manner. Furthermore, the processing control section 27 controls the batch CVD apparatus 1 so that a film may be formed on the wafer 3 appropriately, based on the information sent from the lower side film-thickness monitor 8*a*, the film-thickness measurement section 22, the voltmeter 23, etc. A film-thickness operation device 28 is electrically connected to the film-thickness measurement section 22 serving as a measurement device. Furthermore, the processing control device 27 is electrically connected to the film-thickness operation device 28. In this CVD apparatus 1, the film-thickness operation device 28 is incorporated integrally into the processing control device 27. This film-thickness operation device 28 calculates the thickness of a film deposited on the surface of each of the wafers 3 based on such an amount of the deposited film 26 as to have been measured by the film-thickness measurement section 22.

Figure 3:
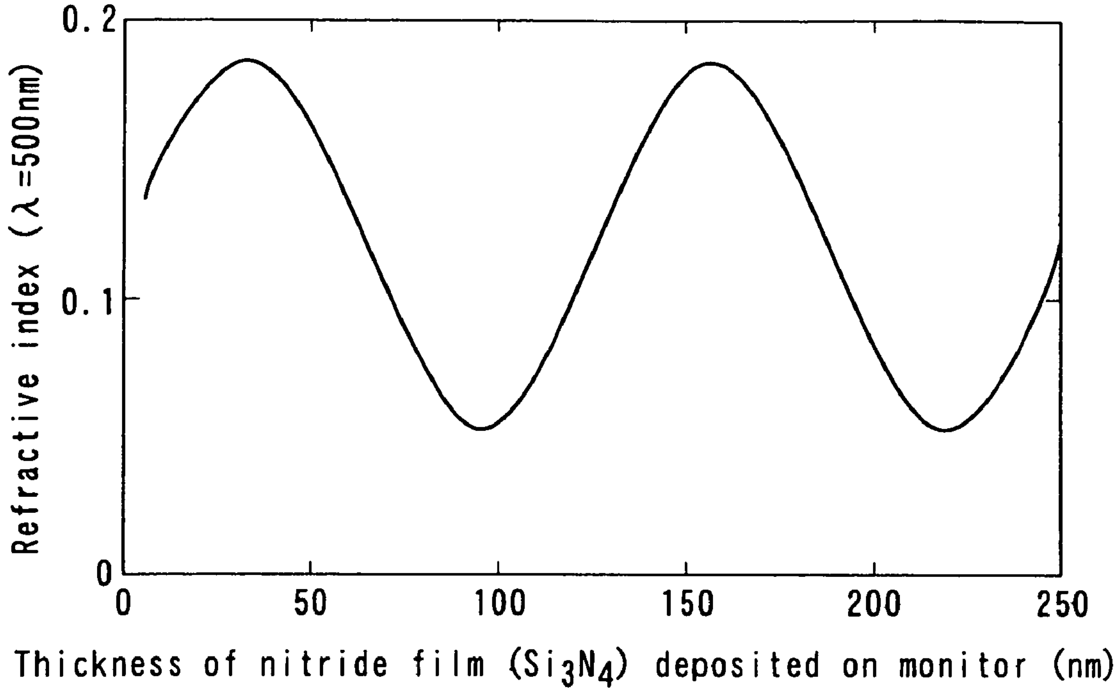
FIG. 3 is a characteristic graph for showing a correlation between a nitride film deposited on the monitoring section of the film-thickness monitoring device of FIG. 2 and a reflection coefficient.

FIG. 3 is a graph showing the correlation between the amount of the deposited film 26 deposited on the upper surface of the monitoring section 29 and the reflection coefficient (reflection intensity) of measurement light having a wavelength of about 500 nm. In this case, the amount of the deposited film 26 refers to, for example, a film thickness of the nitride film ($Si_3N_4$). The film thickness of the $Si_3N_4$ film 26 can be determined by performing time-series analysis on a peak and its size of the graph of FIG. 3. This analysis is performed by the film-thickness operation device 28. When the film thickness of the $Si_3N_4$ film 26 has reached a desired value, the processing control device 27 stops film depositing processing (film formation step) by the CVD apparatus 1.

In the CVD apparatus 1, a reflectivity (a reflection coefficient) of measurement light is measured at the film-thickness measurement section 22 in order to measure the amount of the deposited film 26 on the monitoring section 29. The film-thickness measurement section 22, therefore, has a built-in reflectivity (reflection coefficient) meter. Note here that the system might well be so set that the amount of the deposited film 26 may also be measured by measuring a polarization coefficient meter. In this case, the film-thickness measurement section 22 can have a built-in polarization coefficient meter instead. The measurement light emitted by the film-thickness measurement section 22 may be laser light, visible light, or any other having a variety of wavelengths.

As described above, in this batch CVD apparatus 1, a measurement optical path composed of the light application section 16, the application light, the reflected light, the light reception section 30, etc. is isolated by the monitor protection tube 15 from the atmosphere in the reaction chamber 2, a substance introduced in the reaction chamber 2, etc. By this configuration, there is almost no possibility that the measurement optical path will be affected by the atmosphere in the reaction chamber 2, the substance introduced in the reaction chamber 2, etc. There is no possibility either that the accuracy in measurement at the film-thickness measurement section 22 may be deteriorated by the atmosphere in the reaction chamber 2, the substance introduced therein, etc. Furthermore, in the CVD apparatus 1, only by providing the measurement optical path inside the reaction chamber 2, the film thickness can be measured appropriately. In this case, the setting of the various apparatuses including the lower side film-thickness monitor 8*a* is scarcely subject to restrictions due to the size and shape of the reaction chamber 2. Further, the measurement light has substantially no effect on the atmosphere in the reaction chamber 2, the substance introduced therein, or the wafer 3 being processed.

Thus, in the CVD apparatus 1, the film thickness measurement accuracy substantially unaffected by the reaction chamber 2 and its internal environment. In the CVD apparatus 1, therefore, irrespective of the kind of film to be formed, the accuracy in film formation processing can be improved easily to form the film in an appropriate condition. As a result, a good quality film can be obtained easily.

Figure 4:
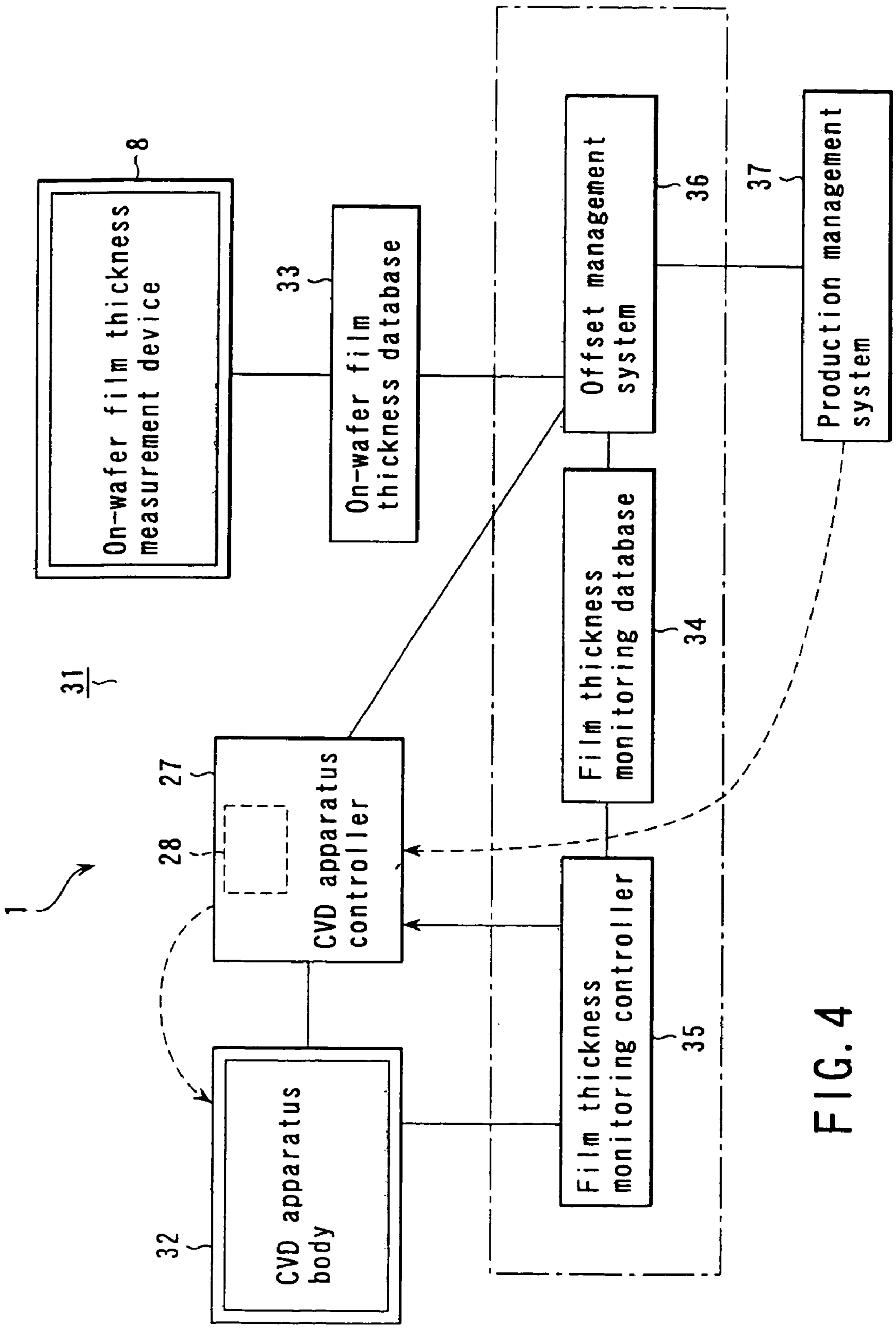
FIG. 4 is a block diagram for showing a semiconductor device manufacturing system provided with the CVD apparatus of FIG. 1.

The following will describe a semiconductor device manufacturing system related to the one embodiment with reference to FIG. 4. FIG. 4 is a block diagram outlining a configuration of a semiconductor device manufacturing system 31.

As shown in FIG. 4, the manufacturing system 31 is so-called a film formation system, and it uses the above-mentioned film formation apparatus (batch CVD apparatus) 1. Components enclosed by a one-dot chain line in FIG. 4 feature the film formation system 31.

This film formation system 31 comprises the batch CVD apparatus 1, subject piece database section 33, and a monitoring database section 34. The subject piece database 33 stores data relating to the thickness of a film to be deposited as a subject piece on the wafer 3. The monitoring database section 34, on the other hand, stores data of the deposited amount of a deposited subject measured by the film-thickness monitor 8 serving as an on-wafer film-thickness measurement device. Further, the monitoring database section 23 stores a correlation parameter which describes a correlation between data of the deposited amount and data of the film thickness on the wafer 3. In this configuration, the film-thickness operation device 28 is set to determine the thickness of a film deposited on the wafer 3 based on the data of the film thickness on the wafer 3, the data of the deposited amount on the monitoring section 29, and the correlation parameter.

Furthermore, in this film formation system 31, the subject piece database section 33 and the monitoring database section 34 are set so as to store the data each time new film-thickness data and deposited amount data are obtained, respectively. Further, the monitoring database section 34 is set so as to update the correlation parameter based on the new film-thickness data and the new deposited amount data.

In this film formation system 31, a schedule (recipe) which describes predetermined processing steps (processing order) is transmitted from a production management system 37 to the processing control device (CVD controller) 27. The CVD controller 27 then controls the operating state of the CVD apparatus 1 (CVD apparatus body 32) according to the predefined recipe. Furthermore, the CVD apparatus 1, which is provided with the film-thickness monitor (in-situ monitor) 8 capable of monitoring the thickness of a film being formed, stops the film formation processing based on the film-thickness information obtained from a film-thickness monitoring controller 35.

In addition, the present film formation system 31 has the above-mentioned two different database sections. One is the subject piece database 33 and the other is the monitoring database section 34. These database sections 33 and 34 are both set so as to be able to store data during film formation processing. That is, the database sections 33 and 34 are a so-called in-situ database section. In FIG. 4, the subject piece database section refers to the on-wafer film-thickness database section 33. The monitoring database section refers to the film-thickness monitoring database section 34. Further, the present film formation system 31 is provided with a film-thickness monitor, now shown, for measuring the thickness of a film which is loaded as unprocessed on the wafer 3. This film-thickness monitor is a so-called ex-situ film-thickness monitor. In the present film formation system 31, the difference between film-thickness information obtained from the in-situ film-thickness monitor 8 and that obtained from the ex-situ film-thickness monitor is managed in comparison by an offset management system 36. It is thus possible in the present film formation system 31 to automatically calibrate anytime the correlation between the film-thickness information obtained from the in-situ film-thickness monitor 8 and the film-thickness information obtained from the ex-situ film-thickness monitor.

The operating state of the offset management system 36 is managed by the production management system 37. An instruction to deposit a film to a predetermined thickness value is sent from the production management system 37 to the offset management system 36. This instruction is converted in the offset management system 36 into film-thickness information to be used in the in-situ film-thickness monitor and then downloaded into the CVD controller 27. Then, a film having the predetermined film thickness can be obtained only by transferring the information between the CVD controller 27 and the film-thickness monitoring controller 35.

This offset management system 36 can be applied to any kind of film formed in the CVD apparatus 1 and processing of forming films of a variety of film-thickness values. Furthermore, the offset management system 36 can control a plurality of CVD apparatuses 1 simultaneously. Furthermore, even when one unit of the CVD apparatus 1 is mounted with a plurality of in-situ film-thickness monitors 8, the offset management system 36 can similarly manage these film-thickness monitors 8 simultaneously. When the plurality of in-situ film-thickness monitors 8 are thus mounted, film-thickness data sent from each of these film-thickness monitors 8 can be individually used by each of the offset management system 36 independently of each other. In this case, as shown in FIG. 1, it is also possible to control the temperature of the interior of the reaction chamber 2 owing to the heaters 9 divided in layout into a plurality of zones at such a value that the film-thickness values of the films respectively deposited on the wafers 3 may be roughly uniform.

As described above, by the present film formation system 31, the above-mentioned batch CVD apparatus 1 is used to control the film formation processing more accurately. In addition, it has a function to compare the film-thickness information obtained from the on-wafer film-thickness measurement device 8 and that of a film actually deposited on the wafer 3. By these features, in the present film formation system 31, the film-thickness measurement accuracy and the film formation processing are less affected by the processing environments and also the processing accuracy is improved further. By the film formation system 31, therefore, the film can be formed in a more appropriate condition, thereby easily obtaining a high quality film.

The following will describe a semiconductor device manufacturing method related to the one embodiment. The semiconductor device manufacturing method of the present embodiment specifically uses the above-mentioned batch CVD apparatus 1 to form a film.

First, a predetermined number of wafers 3 are mounted on the wafer support bench 5, which are then put in the reaction chamber 2. Meanwhile, the power-side film-thickness monitor **8*a* is arranged at a position where the exterior of the monitoring section 29 is exposed to the interior of the reaction chamber 2. In this case, the height of the monitoring section 29 is adjusted so that the thickness of a film deposited on each of the wafers 3 can be monitored in an appropriate condition. Then, the CVD apparatus 1 is activated to start the film formation processing. Meanwhile, the lower side film-thickness monitor 8*a*, the film-thickness measurement section 22, etc. are activated to start measurement of a reflectivity (a reflection coefficient) of the measurement light (reflected light). Then, concurrently with the film formation processing, the amount of the deposited film 26 deposited on the monitoring section 29 is measured. Based on the thus measured amount of the deposited film 26, the thickness of a film deposited on each of the wafers 3 is determined by the film-thickness operation device 28. That is, concurrently with the film formation processing, the thickness of the film deposited on each of the wafers 3** is monitored.

Then, based on a result of this monitoring, the operating state of the CVD apparatus 1 is controlled by the processing control device 27 so that the thin film may be formed on each of the wafers 3 appropriately. That is, concurrently with in-situ monitoring, the film formation processing is controlled so that a desired thin film may be formed on each of the wafers 3. In this case, the controlling of the film formation processing refers to adjusting the kind, the amount, etc. of such a substance used as the material of a film to be introduced into the reaction chamber 2 so that a desired thin film may be formed on each of the wafers 3 appropriately. It also refers to adjusting the temperature, the pressure, the humidity, etc. of an internal atmosphere of the reaction chamber 2 so that the desired thin film may be formed on each of the wafers 3 appropriately.

Thus, concurrently with in-situ monitoring, the film formation processing is continued until a thin film having a desired thickness is formed on each of the wafers 3. When the formation of the film with the desired thickness on each of the wafers 3 is indirectly confirmed by monitoring by the film-thickness measurement section 22, the film-thickness operation device 28, etc., the processing control device 27 stops operation of the CVD apparatus 1. Thus, the thin film having the desired thickness is formed roughly uniformly on each of the wafers 3.

As described above, since the film formation method according to the present embodiment uses the above-mentioned batch CVD apparatus 1, its actions and effects are almost the same as those by the batch CVD apparatus 1. That is, since the present film formation method is scarcely subject in film-thickness measurement accuracy to the restrictions due to the reaction chamber and its internal environment, it is possible to easily improve the accuracy in film formation processing in order to perform it appropriately irrespective of the kind of the film to be formed. As a result, a good quality film can be obtained easily.

The following will describe the effects of the semiconductor device manufacturing method, the semiconductor device manufacturing apparatus, and the semiconductor device manufacturing system according to the present embodiment with reference to FIGS. 5–9.

Figure 8:
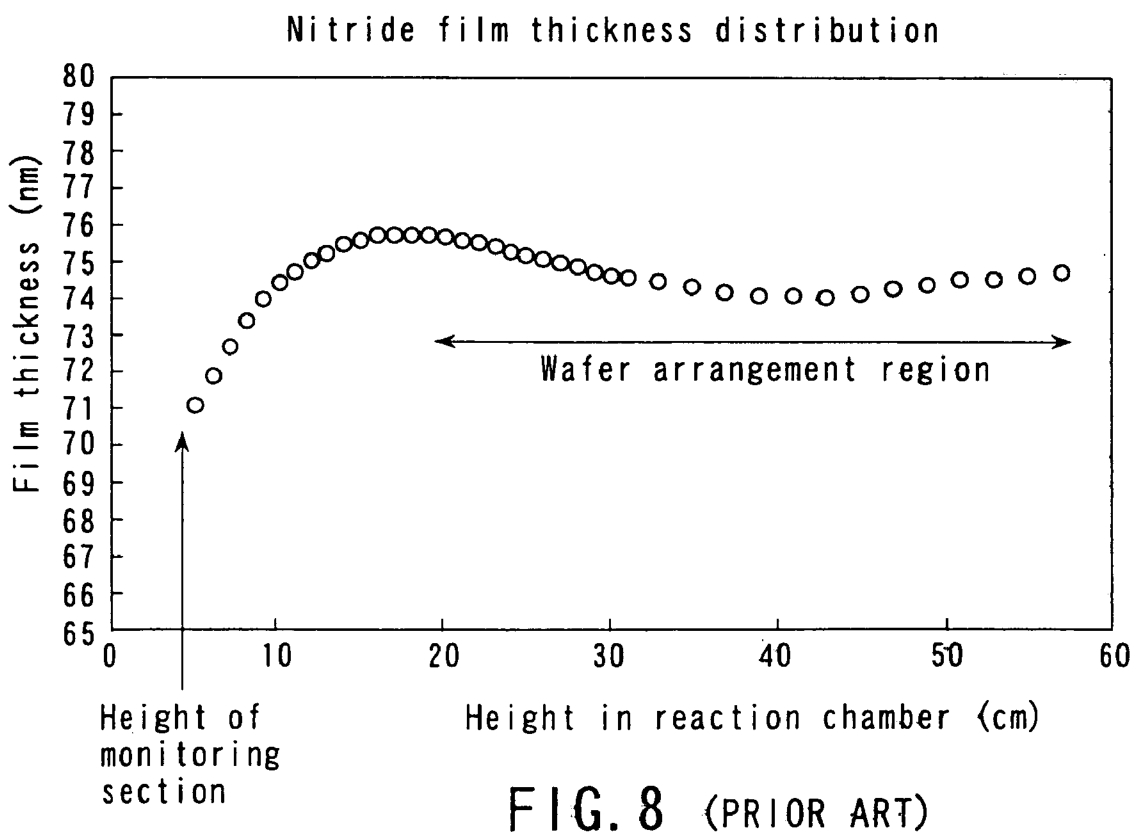
FIG. 8 is a characteristic graph for showing a correlation between the height of the reaction chamber and the thickness of the deposited nitride film when film formation processing is performed according to the conventional technology.
Figure 9:
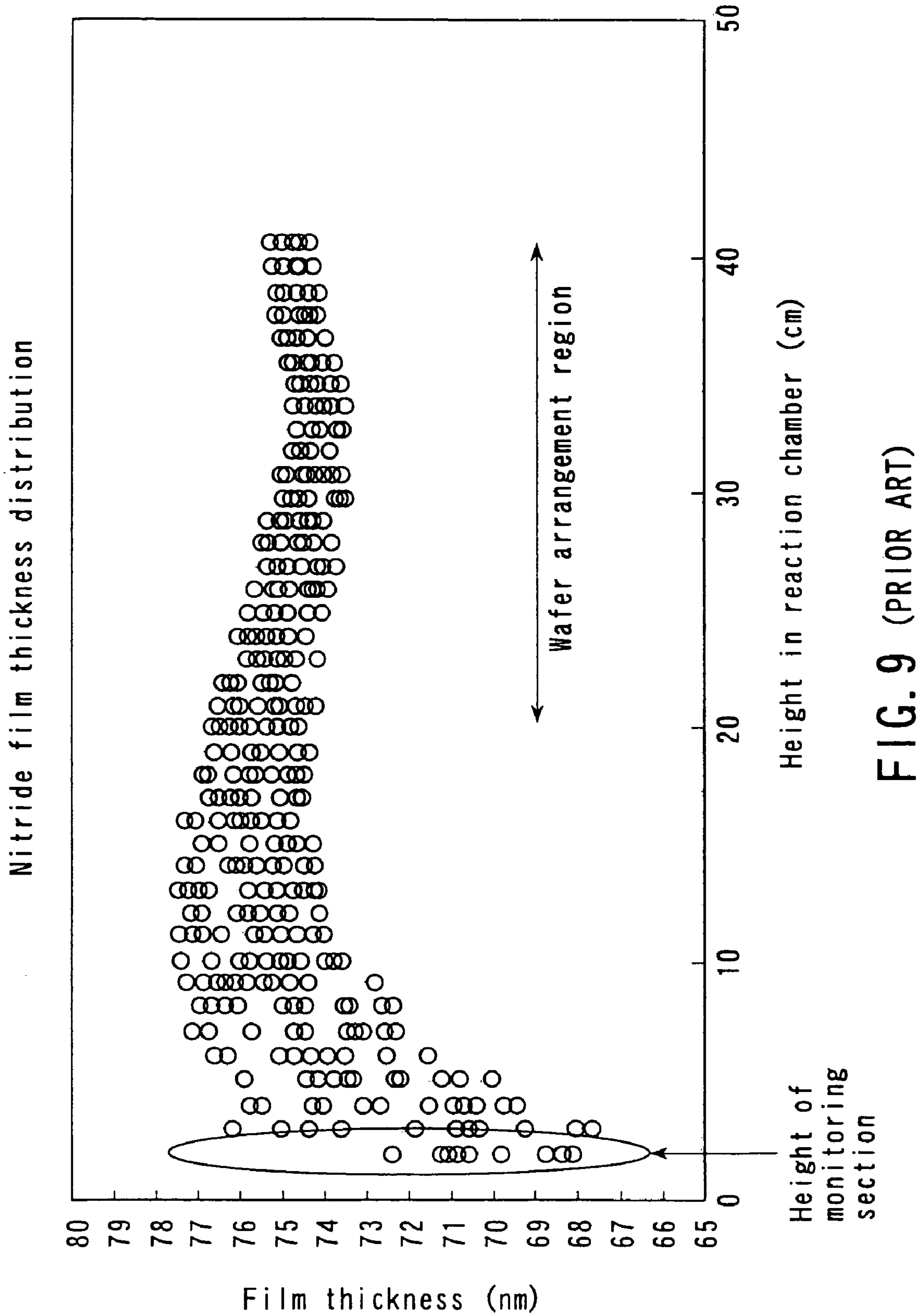
FIG. 9 is a characteristic graph for showing a correlation between the height of the reaction chamber and the thickness of the deposited nitride film when the film formation processing is performed a plurality of number of times according to the conventional technology.

FIG. 8 shows a plot of the correlation between the height of a wafer arranged in the reaction chamber and the film thickness of a nitride film deposited on the wager when film formation processing is performed by a conventional technology, by which the height of the monitoring section is fixed. FIG. 9, on the other hand, shows a plot of the correlation between the height of a wafer arranged in the reaction chamber and the film thickness of the nitride film deposited on the wafer when the film formation processing is performed a number of times according to the conventional technology, by which the height of the monitoring section is fixed.

FIG. 8 indicates that there is a large difference in value between the film thickness of the nitride film deposited on the wafer at its arranging position and that deposited on the in-situ film-thickness monitor at its mounting position. If this difference is stable irrespective of the number of times the film formation processing is performed, it is easy to predict the film thickness of the nitride film on the wafer based on film-thickness information sent from the in-situ film-thickness monitor. FIG. 9 indicates, however, that when the film formation processing is performed a number of times, a distributed range of the accuracy in measurement of the deposited nitride film thickness at the mounting position of the in-situ film-thickness monitor is extremely larger than that of the thickness of the nitride film actually deposited on the wafer in its arranging region. That is, if the film thickness is monitored with the monitoring section of the in-situ film-thickness monitor as fixed, the accuracy (monitoring accuracy) by the in-situ film-thickness monitor is extremely low in measurement of the nitride film thickness, thus the reproducibility of the nitride film thickness is poor. It is, therefore, almost impossible to accurately know the film thickness of a film deposited on a wafer based on the film-thickness information sent from the fixed-type in-situ film-thickness monitor.

Figure 5:
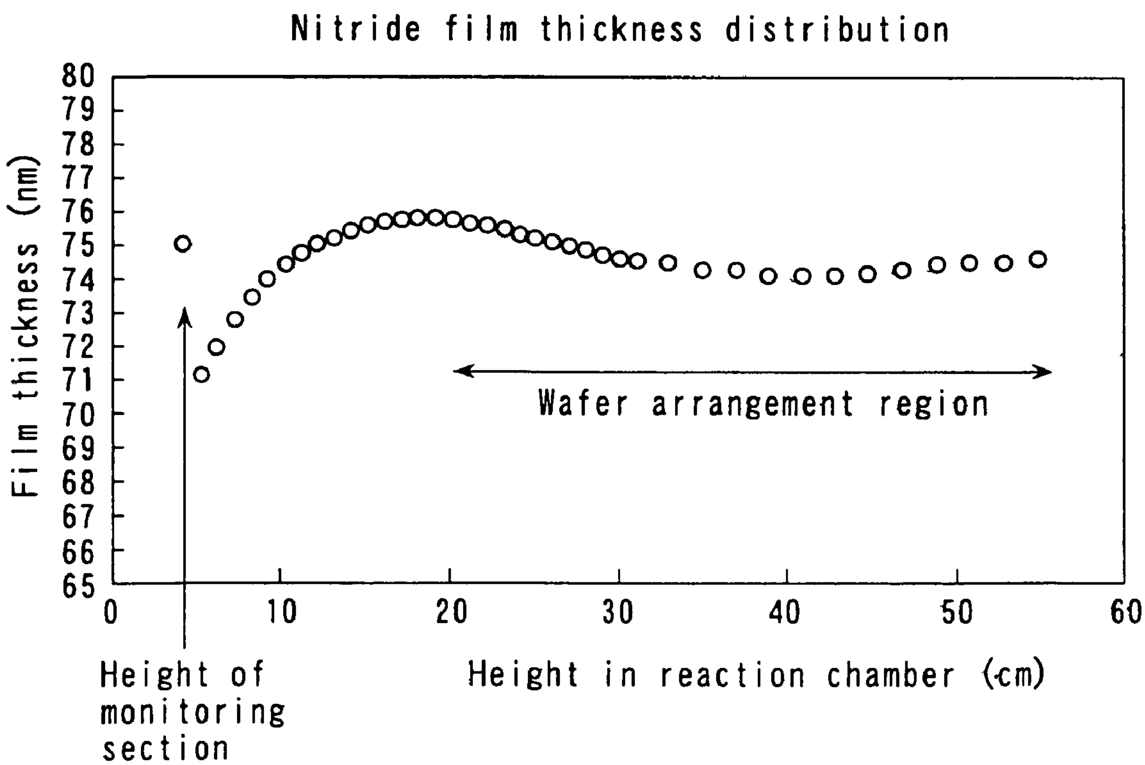
FIG. 5 is a characteristic graph for showing a correlation between a height of a reaction chamber in the CVD apparatus of FIG. 1 and a thickness of a deposited nitride film.
Figure 6:
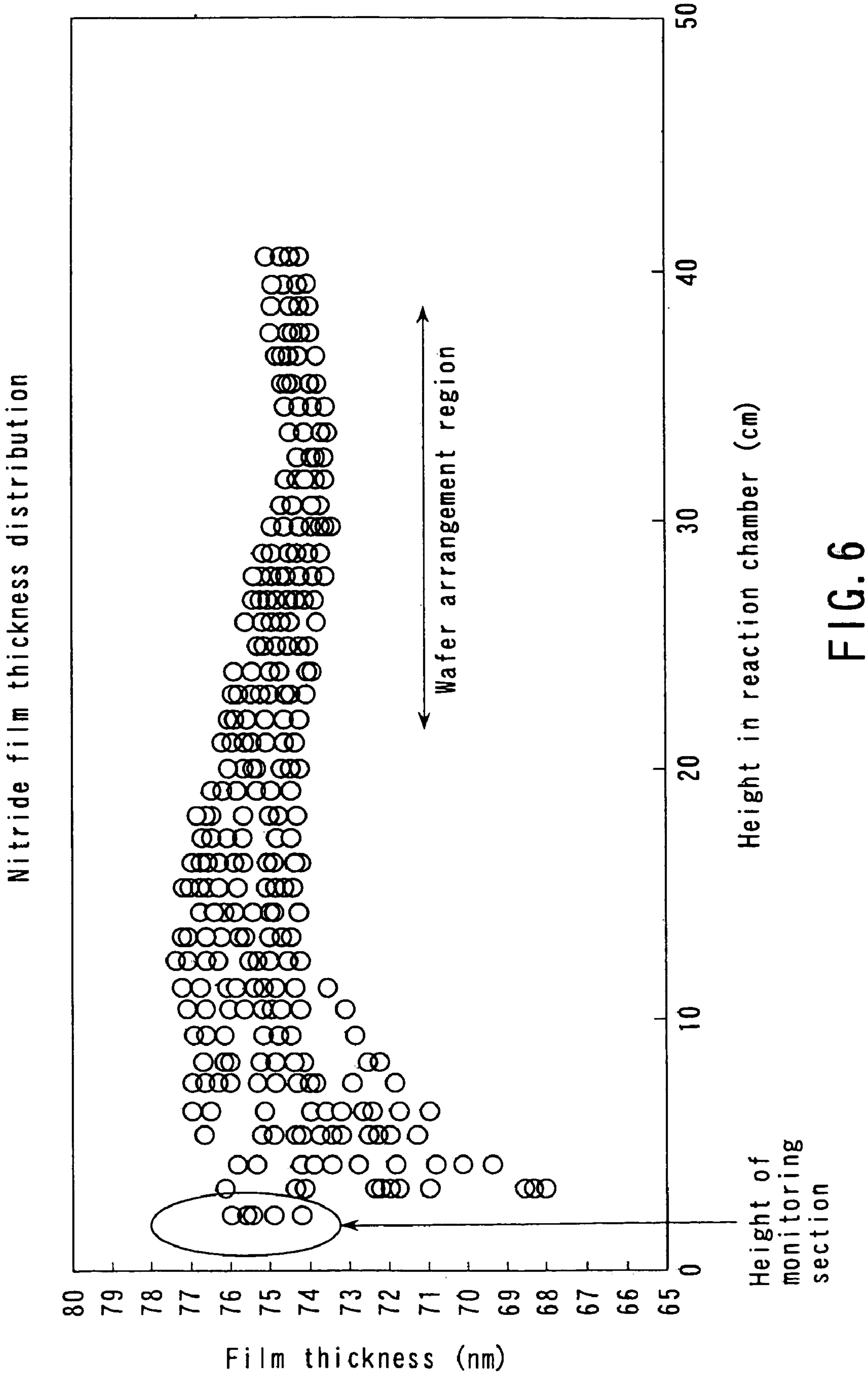
FIG. 6 is a characteristic graph for showing a correlation between the height of the reaction chamber in the CVD apparatus of FIG. 1 and the thickness of the deposited nitride film.

FIG. 5 shows the plotted correlation between the height of a wafer arranged in the reaction chamber and the film thickness of a nitride film deposited on the wafer when the film formation has been performed using the above-mentioned batch CVD apparatus 1. FIG. 6, on the other hand, shows a plot of the correlation between the wafer arranged in the reaction chamber and the thickness of the deposited nitride film deposited on the wafer when the film formation processing has been performed a number of times. In these film formation processes, the film thickness of the deposited film 26 on the monitoring section 29 has been measured while controlling the temperature of the in-situ film-thickness monitor 8*a* simultaneously. As can be seen from FIGS. 5 and 6, irrespective of the number of times of performing the film formation processing, the reproducibility (monitoring accuracy) of the film thickness of the nitride film at the position of the monitoring section 29 is almost the same as the accuracy of the film thickness of the nitride film in the region in which the wafer 3 is arranged.

The experiments carried out by the present inventor et al. have confirmed that by combining the in-situ film-thickness monitor 8*a* and the film formation system 31 in use, the accuracy in measurement of the film thickness of the nitride film can be improved further. Furthermore, it has also been confirmed that by using the position adjustment device (motor) 13 to properly adjust the height of the monitoring section 29 of the in-situ film-thickness monitor 8*a* to an appropriate level, the reproducibility of the film thickness of the nitride film can be improved. Generally, a difference in the kind and thickness of the film to be formed causes a difference in optimal monitoring position (measurement position), so that preferably the position of the monitoring section 29 can be changed.

Figure 7:
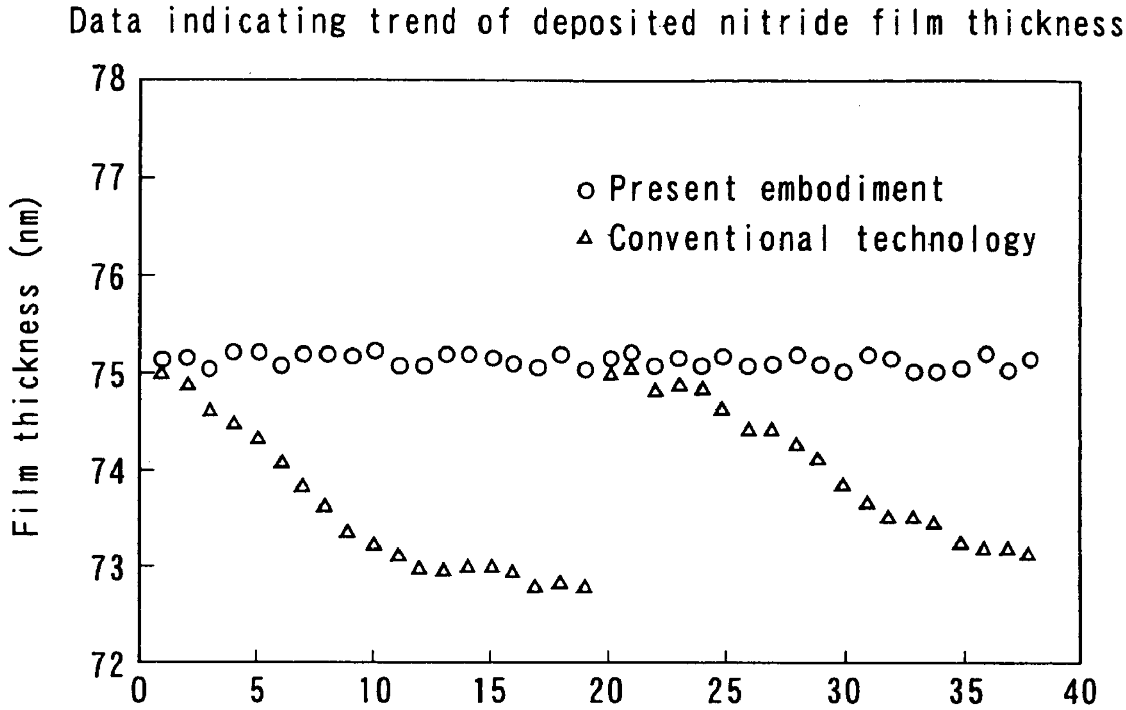
FIG. 7 is a graph for showing a trend of the thickness of the deposited nitride film as compared between the one embodiment and a conventional technology.

FIG. 7 shows a trend of the thickness of a nitride film deposited using the batch CVD apparatus 1 (film formation system 31) related to the present embodiment compared to that of a CVD apparatus related to the conventional technology, having no function of comparing film-thickness information. In these film formation processes, such setting has been made as to deposit the nitride film to a thickness of about 75 nm. Furthermore, a set of about 20 depositing runs (film formation steps) have been repeated in setting. As shown in FIG. 7, when the CVD apparatus related to the conventional technology is used, the reproducibility of the deposited nitride film thickness clearly deteriorates as the number of depositing runs performed increases. In contrast, when the batch CVD apparatus 1 related to the present embodiment is used, such a trend is clear that irrespective of the number of depositing runs performed, the reproducibility of the deposited nitride film thickness is almost the same as a preset target value. That is, it has been found that as compared to the CVD apparatus related to the conventional technology, the batch CVD apparatus 1 related to the present embodiment greatly improves the reproducibility of the deposited nitride film thickness irrespective of the number of film formation steps performed.

The above has described the effects obtained when a nitride film is formed on the wafer 3 by applying the semiconductor device manufacturing method, the semiconductor device manufacturing apparatus, and the semiconductor device manufacturing system according to the present embodiment. The present embodiment, however, is not limited to forming a nitride film. The experiments conducted by the present inventor et al. have found that the same effects as above can be obtained even when a film other than the nitride film is formed using the method, the apparatus, or the system for manufacturing the semiconductor device according to the present embodiment. For example, it has been found that almost the same effects as those of the present embodiment can be obtained even when a film made of poly-silicon, amorphous silicon, or even a variety of oxides is deposited (formed).

The following will describe a cleaning method for a semiconductor device manufacturing apparatus according to the one embodiment. The cleaning method for the semiconductor device manufacturing apparatus of the present embodiment uses the above-mentioned film formation apparatus (batch CVD apparatus) 1.

First, a film is formed on a plurality of wafers according to a film formation method related to the present embodiment, in which wafers 3 with the film formed thereon are taken out from the reaction chamber 2. Then, a cleaning gas capable of removing the deposited film 26 is introduced into the reaction chamber 2 until the amount of the deposited film 26 deposited on the monitoring section 29 measures 0. In such a manner, by the cleaning method of the present embodiment, each time the film formation ends, an extra component which may interfere with the film formation processing to be performed next is removed from the interior of the reaction chamber 2. It is thus possible to keep the interior of the reaction chamber 2 clean so that the film may be formed on each of the wafers appropriately. Of course this cleaning method can be applied to both the case of forming the same kind of film every time and the case of forming each kind of film in each film formation step. To conduct appropriate film formation processing on each of the wafers each time, a cleaning gas containing appropriate components can be introduced into the reaction chamber 2 for each of the film formation processing steps performed.

Thus, the cleaning method for the semiconductor device of the present embodiment makes it possible to keep the interior of the reaction chamber 2 clean so as to conduct appropriate film formation processing on each of the wafers 3 irrespective of the kind etc. of the film to be formed thereon. It is, therefore, possible to employ this cleaning method properly in order to perform film formation processing in an appropriate environment. As a result, a good quality film can be formed on each of the wafers 3.

As described above, by the semiconductor device manufacturing method, the semiconductor device manufacturing apparatus, the semiconductor device manufacturing system, and the cleaning method for a semiconductor device manufacturing apparatus according to the present embodiment, the film formation processing can be performed appropriately with an improved accuracy of film formation irrespective of the kind of film to be formed. Moreover, it is substantially unaffected by the film formation environment. It is, therefore, possible to easily form a good quality film on the wafer irrespective of the kind of film to be formed. It is in turn possible to easily obtain a semiconductor device having a good quality film.

Note here that the semiconductor device manufacturing method, the semiconductor device manufacturing apparatus, the semiconductor device manufacturing system, and the cleaning method for a semiconductor device manufacturing apparatus according to the present embodiment are not limited to the above-mentioned one embodiment. Their configurations and steps can be partially modified in setting variously or combined in setting variously without departing from the gist of the present invention.

For example, another database may be provided which enables referencing a correlation between the thickness values of films on the wafer measured past and the corresponding thickness values of the deposited films 26 on the monitoring section 29. In this case, the film thickness on the wafer can be predicted highly accurately to thereby perform the film formation processing at a higher accuracy.

Furthermore, although the above-mentioned embodiment has used a vertical batch CVD apparatus as the CVD apparatus 1, the present invention is not limited thereto. For example, the CVD apparatus 1 may be of a leaf type.

Furthermore, the present invention is not limited to the batch film formation apparatus or the batch film formation process in application. It is applicable to a variety of processing apparatuses and processes as far as they are capable of controlling the film thickness on a subject piece. In particular, the present invention can be effective when it is applied to a processing apparatus and process in which the film thickness on a subject piece needs to be adjusted highly accurately. For example, it is applicable to an etching apparatus and process in which a film formed on the wafer beforehand is etched off to a predetermined film-thickness. Furthermore, it is sufficiently applicable not only to the cleaning of the atmosphere in the reaction chamber but also to the cleaning of a reaction chamber itself.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A cleaning method for a semiconductor device manufacturing apparatus, comprising:

taking out a subject piece and a film thereon from a processing chamber, after film formation is performed on said subject piece in said processing chamber, the processing chamber including at least one of said subject piece;

applying said light having a predetermined wavelength to a monitoring section which is provided at a tip of at least one monitoring device to indirectly monitor a thickness of a film formed on said subject piece, while said light is isolated from an atmosphere in said processing chamber and a substance in said processing chamber, and introducing cleaning gas capable of removing a substance deposited on said monitoring section into said processing chamber;

measuring a reflection light which is said application light reflected near said monitoring section, while said reflection light is isolated from said atmosphere in said processing chamber and said substance introduced into said processing chamber;

measuring an amount of a substance corresponding to a thickness of a film deposited on said monitoring section based on a measurement result of said reflection light; and introducing, into said processing chamber, a cleaning gas which can remove the substance on said monitoring section until a measurement value of the amount of said substance on said monitoring section becomes 0.

2. The method according to claim 1, wherein said light has a single wavelength.

3. The method according to claim 1, wherein said light has a plurality of different wavelengths.

4. The method according to claim 1, wherein said predetermined wavelength is variable.

5. The method according to claim 1, wherein when measuring said reflecting light, a reflectivity of said reflected light with respect to said application light is measured.

6. The method according to claim 1, wherein when measuring said reflected light, a polarization coefficient of said reflected light with respect to said application light is measured.

7. The method according to claim 1, wherein when measuring said reflected light, said monitoring section is adjusted to have a predetermined temperature.

8. The method according to claim 1, wherein when measuring said reflected light, said monitoring section is adjusted to be positioned at a predetermined position.

* * * * *